(12) United States Patent
Johnsen

(10) Patent No.: US 7,166,943 B2
(45) Date of Patent: Jan. 23, 2007

(54) ROTATING RECTIFIER ASSEMBLY WITH INNER MOUNTED DIODES

(75) Inventor: Tyrone Arthur Johnsen, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 11/044,688

(22) Filed: Jan. 27, 2005

(65) Prior Publication Data
US 2006/0163957 A1    Jul. 27, 2006

(51) Int. Cl.
*H02M 1/00* (2006.01)
*H02K 11/04* (2006.01)

(52) U.S. Cl. .................... 310/68 D; 363/145
(58) Field of Classification Search .......... 310/68 D; 363/145
See application file for complete search history.

(56) References Cited

U.S. PATENT DOCUMENTS

| | | | |
|---|---|---|---|
| 3,562,564 A * | 2/1971 | Potter ............... | 310/54 |
| 3,602,747 A * | 8/1971 | Stroppa et al. ........ | 310/68 D |
| 3,684,944 A | 8/1972 | Evgrafov | |
| 3,721,843 A | 3/1973 | Spisak | |
| 3,723,794 A * | 3/1973 | Spisak et al. ......... | 310/68 D |
| 3,959,705 A | 5/1976 | Salihi | |
| 3,970,881 A | 7/1976 | Sato | |
| 4,035,714 A | 7/1977 | Sato | |
| 4,143,414 A | 3/1979 | Brewster | |
| 4,581,695 A | 4/1986 | Hoppe | |
| 4,780,619 A | 10/1988 | Campbell | |
| 4,853,557 A | 8/1989 | Meier | |
| 4,959,577 A | 9/1990 | Radomski | |
| 5,164,624 A | 11/1992 | Desai | |
| 5,369,541 A | 11/1994 | Normet | |
| 5,502,368 A | 3/1996 | Syverson | |
| 5,519,275 A | 5/1996 | Scott | |
| 5,656,922 A | 8/1997 | LaVelle | |
| 5,710,467 A | 1/1998 | Irie | |
| 5,737,210 A | 4/1998 | Barahia | |
| 6,107,711 A | 8/2000 | Borchert | |
| 6,661,135 B1 | 12/2003 | Borden | |

FOREIGN PATENT DOCUMENTS

| | | | |
|---|---|---|---|
| EP | 456 389 | * | 11/1991 |
| JP | 03-253252 | * | 11/1991 |

* cited by examiner

*Primary Examiner*—Burton Mullins
(74) *Attorney, Agent, or Firm*—Carlson, Gaskey & Olds

(57) ABSTRACT

The present invention is a rectifier assembly, which has a first support and a second support. The supports have either a ring or plate shape. Each support has an inner peripheral surface with inwardly facing diode mounting surfaces. A diode is mounted to each of the inwardly facing diode mounting surfaces. Phase connectors connect one diode from the first support with one diode from the second support. The supports are received within an electrically insulated housing. The diodes are connected to the supports such that when assembled, each diode is perpendicular to a central axis that extends along a length the electrically insulated housing. During operation of the rectifier assembly, both supports rotate about the axis.

19 Claims, 8 Drawing Sheets

ROTATING RECTIFIER ASSEMBLY WITH INNER MOUNTED DIODES

BACKGROUND OF THE INVENTION

The present invention is a rectifier configuration that can be used with a number of applications, in particular brushless generators.

Rectifier assemblies have been incorporated into rotors for electromagnetic machines in order to eliminate the need for conduction brushes. However, in this configuration, the rectifier assemblies are subjected to harsh environments. Environmental factors such as mechanical loads, hydraulic fluid flow, and temperature extremes, for example, can adversely affect efficient operation of the rectifier assemblies. Further, this exposed configuration of the rectifier assemblies increases the potential for damage to the rectifier assemblies during assembly and handling of the rotor.

Also, as a result of attachment to the rotor, the rectifier assemblies are subject to high centrifugal forces during operation. The high centrifugal forces create problems within the rectifier assemblies by placing diodes within the rectifier assemblies under sheer, or tensile stress during operation. In addition, high operating speeds can also subject the rectifier assemblies to excessive heat. The excessive heat must be dissipated from the rectifier assembly, especially away from the diodes in order to maintain efficient operation of the rectifier assembly.

The harsh loading and heat conditions on the rectifier assemblies also cause excessive wear on the assemblies, in particular the diodes. Additionally, these harsh loading and heat conditions can adversely affect electrical contacts between internal components of the rectifier assembly. If electrical contacts are not maintained, the rectifier assembly will not operate effectively. The rectifier assemblies must be serviced to replace worn and failed diodes. Because of the difficulty of service and assembly, the entire rectifier assembly must often be replaced when a diode fails, which is expensive.

Thus, a rectifier assembly that can operate in a harsh environment, can withstand handling and assembly operations to the rotor, and which can be easily serviced is needed.

SUMMARY OF THE INVENTION

The present invention is a rectifier assembly, which has a first support and a second support that each have an inner peripheral surface with a plurality inwardly facing diode mounting surfaces. A diode is mounted to each of the inwardly facing diode mounting surfaces. The diodes are all mounted in compression.

In one example, the first and second supports are ring shaped. The inner peripheral surface of each ring includes three diode mounting surfaces. Phase connectors each connect one diode from the first support to one diode from the second support. The phase connectors each correspond to one AC phase. Each of the phase connectors has a stress relief loop to reduce stress on the phase connectors during operation. In addition, the stress relief loop acts as a spacer between the first support and the second support to electrically isolate the supports from each other.

An electrically insulated housing has a generally circular cross-section defining an axis that runs axially down a center of the electrically insulated housing. The first support and the second support both have outwardly facing surfaces that are shaped to correspond to the shape of the electrically insulated housing. The diodes are connected to the first and second supports such that when assembled the diodes are each perpendicular to the axis. During operation of the rectifier assembly, the first and second supports rotate about the axis.

The first support and second supports also act as heat sinks to remove heat that is generated during operation of the rectifier assembly. The outwardly facing surfaces of each support may have various surface textures or shapes to assist in removing heat from the diodes.

In another example, the first and second supports are shaped as plates. The first and second supports each have an inwardly facing surface that is generally flat. Outwardly facing surfaces of each support have an arcuate shape. Three diode mounting locations are located on each inwardly facing surface. A diode is mounted at each of the diode mounting locations. Phase connectors each connect one diode of the first support to one diode of the second support. The first support and the second support are received within an electrically insulated housing having a generally circular cross-section. The first support and second support are electrically isolated from one another. An axis runs axially down the center of the electrically insulated housing. When the first support and the second support are assembled into the electrically insulated housing, the diodes are perpendicular to the axis and are facing each other.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
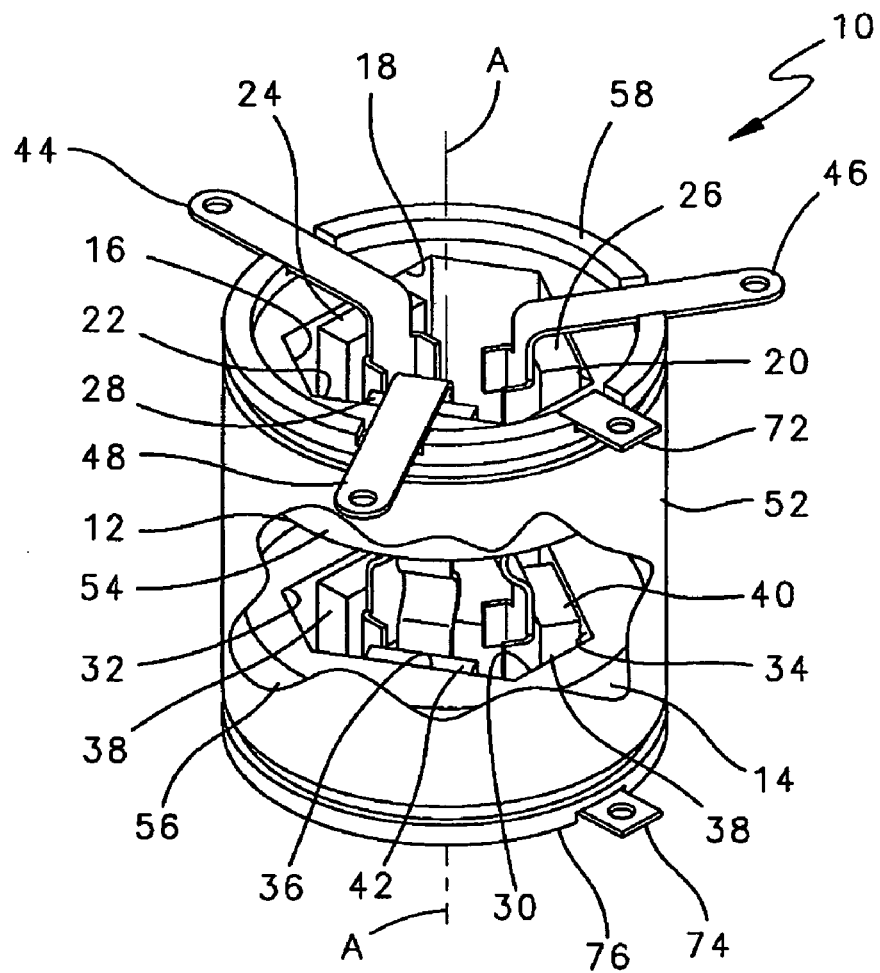
FIG. 1 illustrates a general perspective view of one embodiment of the rectifier assembly of the present invention using ring shaped supports.

FIG. 1 illustrates a general view of a rectifier assembly 10 having a first support 12 and a second support 14. In this embodiment the first support 12 and the second support 14 each have a ring shape. The first support 12 has an inner peripheral surface 16 with three inwardly facing diode mounting surfaces 18, 20, 22, respectively. A first diode 24, a second diode 26, and a third diode 28 are mounted to each of the inwardly facing diode mounting surfaces 18, 20, 22, respectively. The second support 14 has a similar arrangement with a second inner peripheral surface 30 that has three inwardly facing diode mounting surfaces 32, 34, 36. A fourth diode 38, a fifth diode 40, and a sixth diode 42 are mounted to each of the inwardly facing diode mounting surfaces 32, 34, 36, respectively.

The first through sixth diodes 24, 26, 28, 38, 40, 42 are all mounted such that compressive forces act on the diodes after they are mounted. The compressive forces acting on the first through sixth diodes 24, 26, 28, 38, 40, 42 increase during operation of the rectifier assembly 10, as described below.

Three phase connectors 44, 46, 48, connect the first support 12 and the second support 14. The first phase connector 44 connects the first diode 24 from the first support 12 and the fourth diode 38 from the second support 14. The second phase connector 46 connects the second diode 26 from the first support 12 and the fifth diode 40 from the second support 14. The third phase connector 48 connects the third diode 28 from the first support 12 and the sixth diode 42 from the second support 14. The three phase connectors 44, 46, 48 each correspond to one AC phase.

Figure 2:
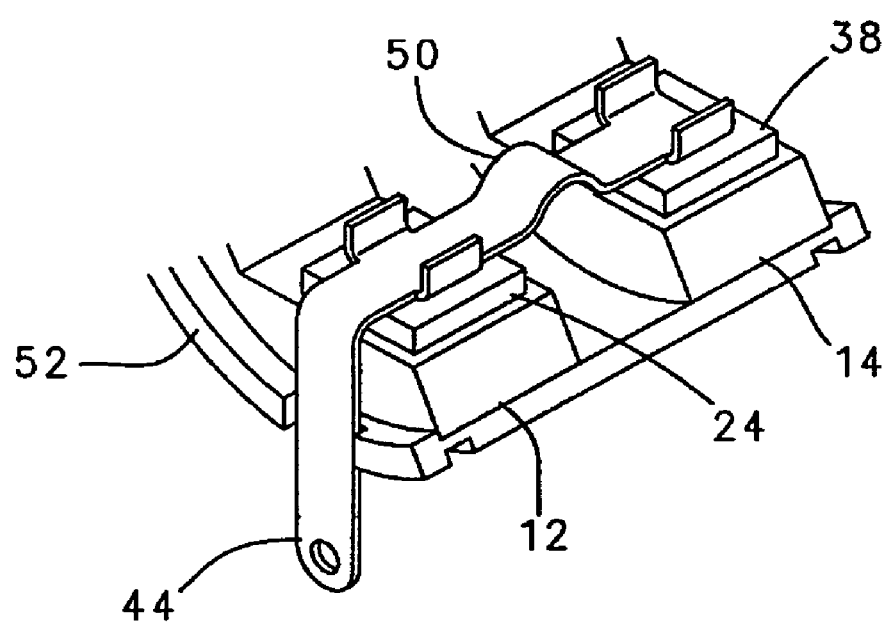
FIG. 2 is a perspective view of an example phase connector and supports assembled together.

Referring to FIG. 2, which shows the first phase connector 44 as an example, a stress relief loop 50 is included on each of the three phase connectors 44, 46, 48 to reduce stress on the phase connectors 44, 46, 48 during operation of the rectifier assembly 10. In addition, the stress relief loop 50 acts as a spacer between the first support 12 and the second support 14 to keep the first support 12 and the second support 14 electrically isolated from one another.

An electrically insulated housing 52 has a generally circular cross-section defining an axis A (FIG. 1) that runs axially down a center of the electrically insulated housing 52. The first support 12 and the second support 14 are received within the electrically insulated housing 52 (a portion of the electrically insulated housing 52 is cut out in FIG. 1 for illustration purposes). A first outwardly facing surface 54 on the first support 12 and a second outwardly facing surface 56 on the second support 14 are both shaped to correspond to the shape of the electrically insulated housing 52. The axis A is generally parallel to the three phase connectors 44, 46, 48. The first diode 24, the second diode 26, the third diode 28, the fourth diode 38, the fifth diode 40, and the sixth diode 42 are each connected to one diode mounting surface 18, 20, 22, 32, 34, 36 on the respective first 16 and second 30 inner peripheral surface so that the first though sixth diodes 24, 26, 28, 38, 40, 42 are each perpendicular to the axis A.

The axis A is located at the center of the first and second supports 12 and 14. During operation of the rectifier assembly 10, the first and second supports 12 and 14 rotate about the axis A. Forces acting upon the first through sixth diodes 24, 26, 28, 38, 40, 42 press the first through sixth diodes 24, 26, 28, 38, 40, 42 outward from the axis A. The first and second supports 12 and 14 are relatively rigid. In addition, the three phase connectors 44, 46, 48 are pressed outward from the axis A and into the first through sixth diodes 24, 26, 28, 38, 40, 42. This increases the compressive forces acting on the first through sixth diodes 24, 26, 28, 38, 40, and 42.

Diodes are typically mounted such that shear forces act on the diodes during operation of the rectifier assembly. The shear forces increase the stress on the diodes, which causes the diodes to wear more quickly. Reducing operating speeds of the rectifier assemblies decreases operational stresses acting on the diodes, however, this is not a desirable solution. By mounting the first through sixth diodes 24, 26, 28, 38, 40, and 42 in compression, shear stress is reduced during operation of the rectifier assembly 10. As a result, higher operating speeds of the rectifier assembly 10 can be achieved without increasing wear.

Figure 3A:
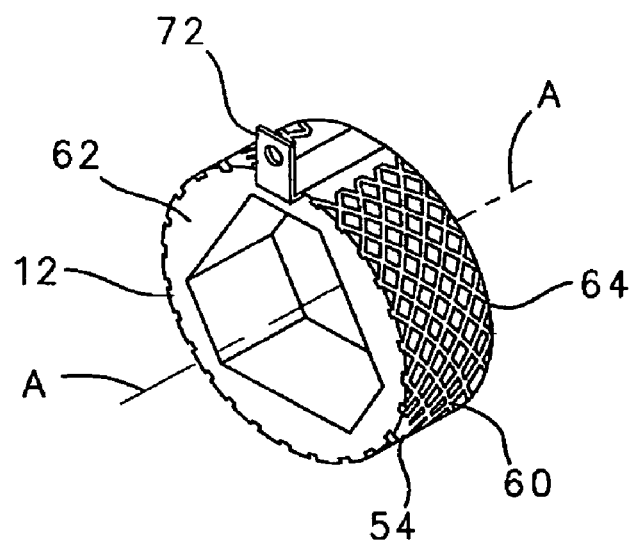
FIG. 3a is a perspective view of a first support showing a crosshatch groove pattern on an outer peripheral surface.
Figure 3B:
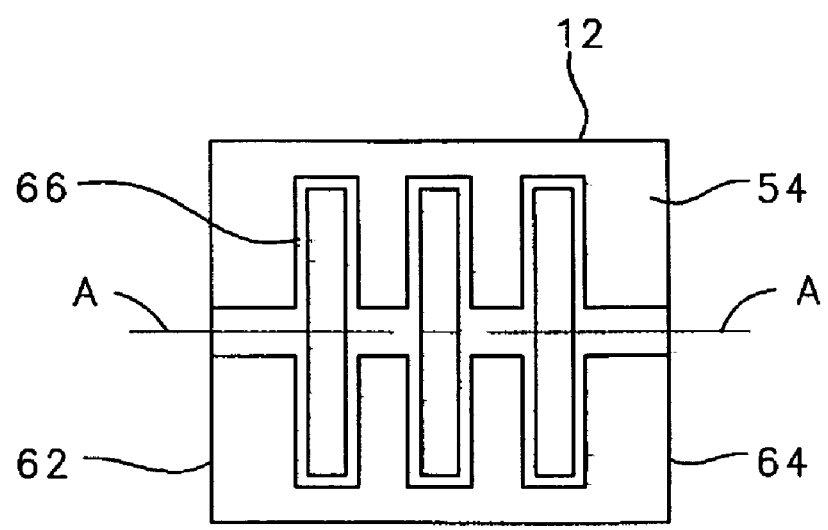
FIG. 3b is a side view of a first support showing a box groove pattern on an outer peripheral surface.
Figure 3C:
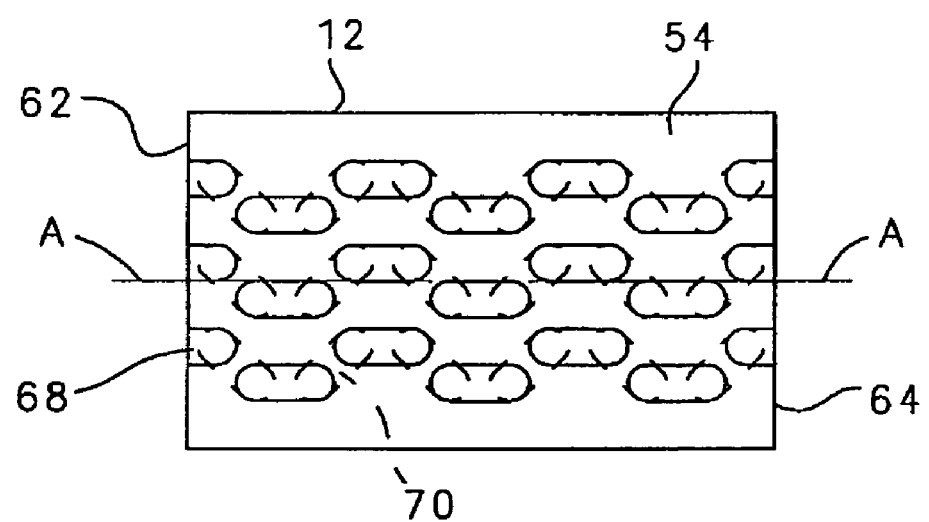
FIG. 3c is a side view of a first support showing a two-layer groove pattern on an outer peripheral surface.

The first support 12 and the second support 14 also act as heat sinks to remove heat that is generated from the first through sixth diodes 24, 26, 28, 38, 40, and 42 during operation of the rectifier assembly 10. The first outwardly facing surface 54 and second outwardly facing surface 56 each may have various surface textures or shapes to assist in heat removal from the first though sixth diodes 24, 26, 28, 38, 40, 42. FIGS. 3a–c illustrate examples of various arrangements which may be applied. For simplicity, the first support 12 is shown as an example. The second support 14 may have similar arrangements.

FIG. 3a shows the first support 12 having a crosshatch pattern of grooves 60 on the first outwardly facing surface 54. During operation, oil flows from a first end 62 of the first support 12 to an opposing end 64. Since the oil flow is generally on the outside of the first support 12, the first though sixth diodes 24, 26, 28, 38, 40, 42 are protected from most of the exposure to the oil, which decreases the wear on the diodes while still removing heat generated during operation.

FIG. 3b shows a box groove pattern. Oil flows from the first end 62 of the first support 12 into groove 66 and out at the opposing end 64 of the first support 12.

FIG. 3c shows a two-level groove pattern. Oil flows into a first layer of grooves 68 at the first end 62. From the first layer grooves 68 oil can then reach a second layer of grooves 70. The oil flows between layers until it reaches an opposing end 64 of the first support 12.

Referring back to FIG. 1, the phase connectors 44, 46, 48 are shaped such that they each extend outwardly from a first end 58 of the electrically insulated housing 52. In addition, the first support 12 has a positive output terminal 72 and the second support 14 has a negative output terminal 74. The positive output terminal 72 extends from the first support 12 to a first end 58 of the electrically insulated housing 52. The negative output terminal 74 may extend to the first end 58 of the electrically insulated housing 52, or to an opposing end 76 of the electrically insulated housing 52 depending on the application for which the rectifier assembly 10 is intended. Those skilled in the art would know the proper arrangement for the output terminals 72, 74.

Figure 4:
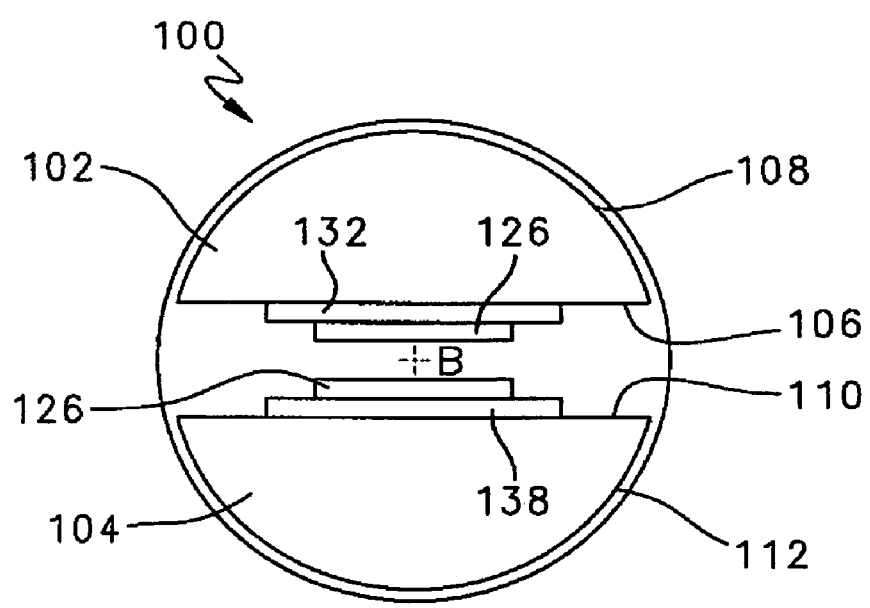
FIG. 4 is an end view of another embodiment of a rectifier assembly of the present invention.

FIG. 4 refers to a rectifier assembly 100 of an alternate embodiment of the present invention. The rectifier assembly 100 has a first support 102 and a second support 104 that are shaped as plates. The first support 102 has a first inwardly facing surface 106, and a first outwardly facing surface 108. The first inwardly facing surface 106 is generally flat. The first outwardly facing surface 108 has an arcuate shape. The second support 104 has a second inwardly facing surface 110 and a second outwardly facing surface 112, each have the same corresponding shape as those of the first support 102.

Figure 5:
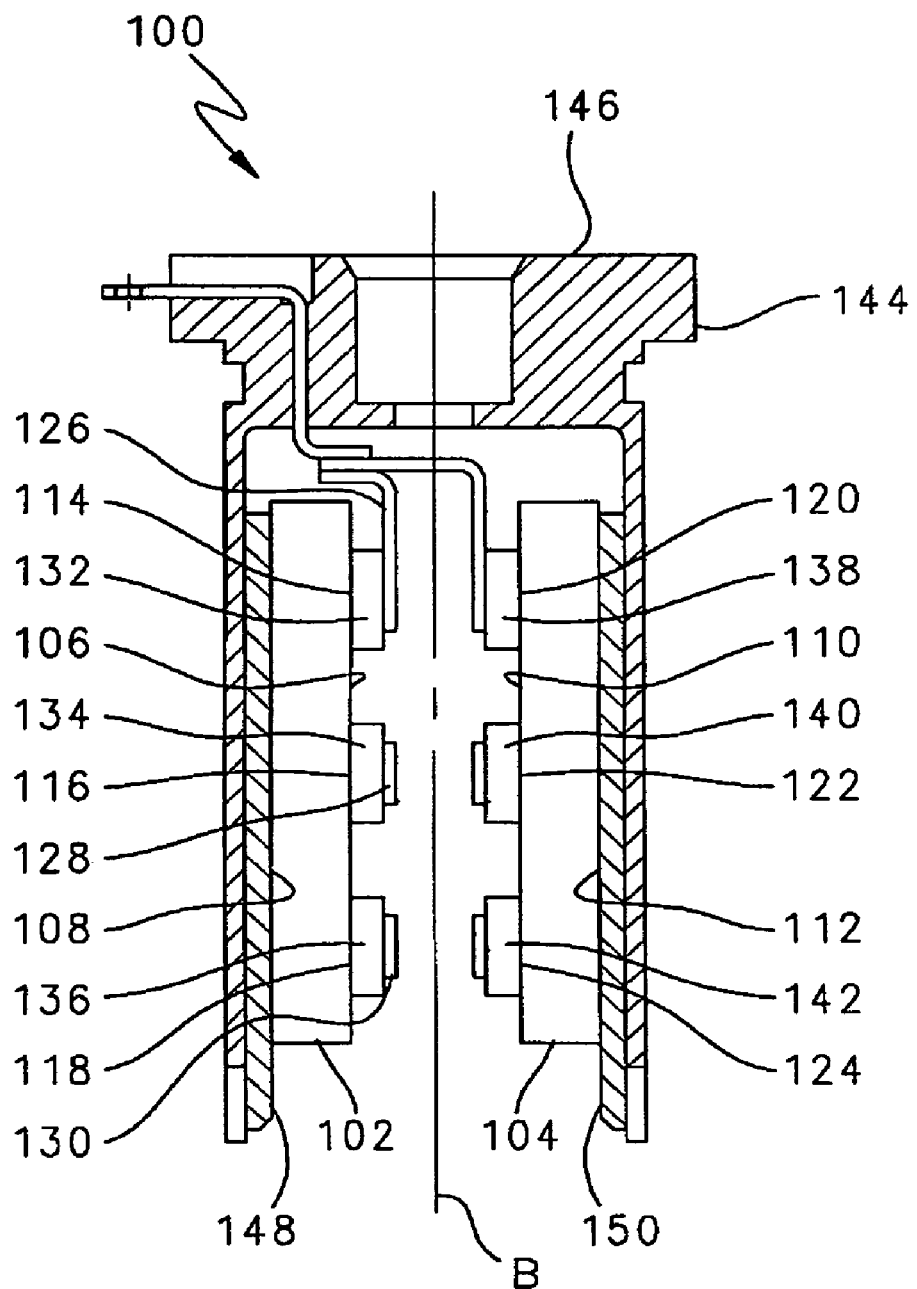
FIG. 5 is a cross-section of another embodiment of a rectifier assembly of the present invention using plate shaped supports.

Referring to FIG. 5, the first inwardly facing surface 106 has three diode mounting locations 114, 116, 118. Likewise the second inwardly facing surface 110 has three diode mounting locations 120, 122, 124. A diode 132, 134, 136, 138, 140, 142 is mounted, in compression, at each of the diode mounting locations 114, 116, 118, 120, 122, 124. The first support 102 acts as a positive output terminal and the second support 104 acts as a negative output terminal.

Three phase connectors 126, 128, 130 each connect a diode of the first support 102 with a diode of the second support 104. The first phase connector 126 connects a first diode 132 with the fourth diode 138. The position of the first diode 132 on the first support 102 and the position of the fourth diode 138 on the second support 104 may correspond to one another for convenience. However, other arrangements, which accomplish the same goal, may also be used. The second phase connector 128 connects the second diode 134 and the fifth diode 140. The second diode 134 and the fifth diode 140 are preferably located in the center mounting locations 116, 122 of the first support 102 and second support 104 respectively. The third phase connector 130 connects the third diode 136 and the sixth diode 142.

An electrically insulated housing 144 has a generally circular cross-section. The first support 102 and the second support 104 are received within the electrically insulated housing 144. The first inwardly facing surface 106 and the second inwardly facing surface 110 are spaced apart and facing each other. The first outwardly facing surface 108 and the second outwardly facing surface 112 have curvatures that correspond to the shape of the electrically insulated housing 144.

The first support 102 and second support 104 are electrically isolated form one another. An axis B runs axially down the center of the electrically insulated housing 144. When the first support 102 and the second support 104 are assembled into the electrically insulated housing 144, the first through sixth diodes 132, 134, 136, 138, 140, 142 are perpendicular to the axis B and facing each other.

Figure 6:
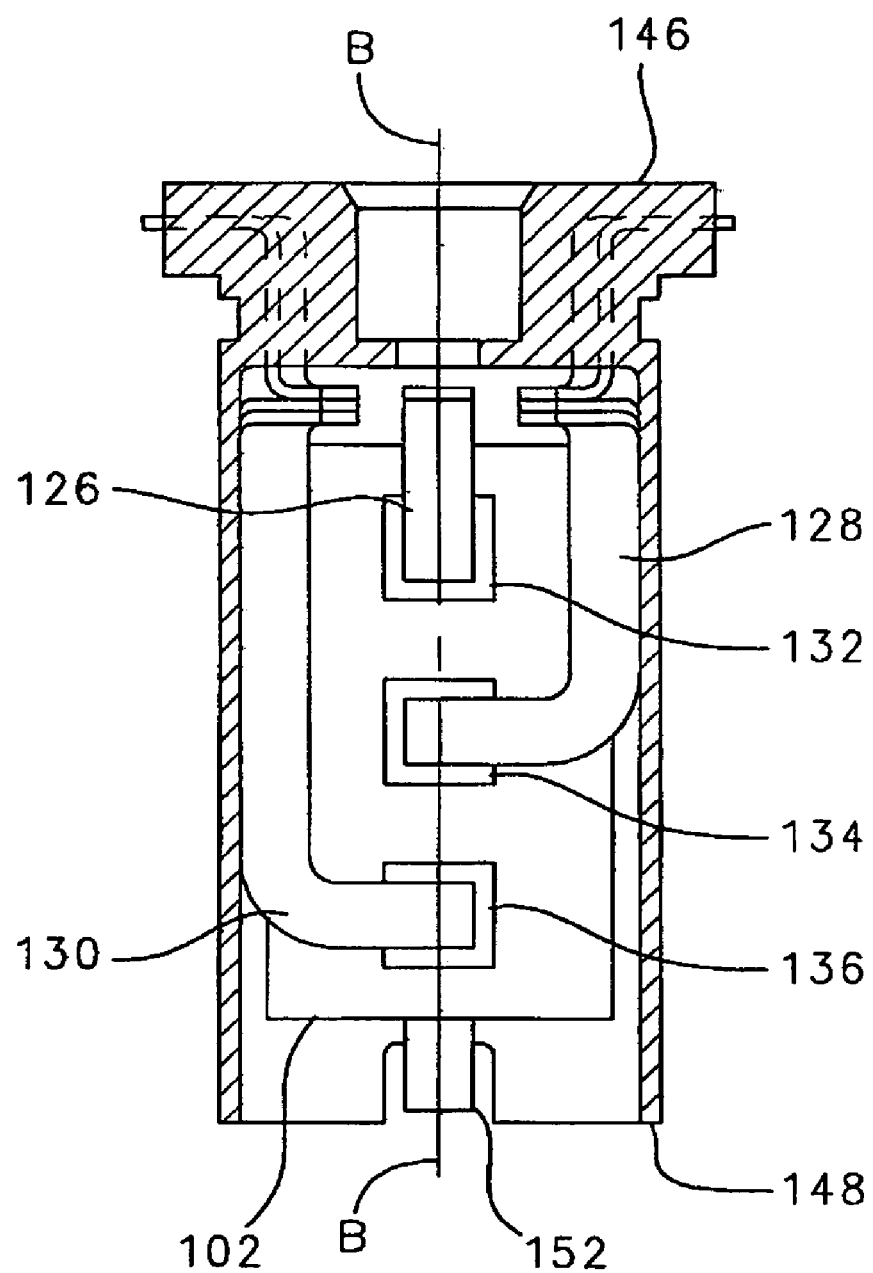
FIG. 6 is a cross-section of the embodiment of FIG. 5 showing the first support and phase connectors assembled together.

FIG. 6 shows an example of the first support 102. The second support 104 has a similar arrangement. The three phase connectors 126, 128, 130 are shaped such that they all extend outwardly from a first end 146 of the electrically insulated housing 144. In addition, the first support 102 and the second support 104 each have an output terminal 148, 150 (FIG. 5). Each output terminal 148, 150 may extend from the first end 146 of the electrically insulated housing 144, or from opposing end 152 of the electrically insulated housing 144 depending on the application for which the rectifier assembly 100 is intended. Those skilled in the art would know the proper arrangement for the output terminals 148, 150.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A rectifier assembly comprising:
    a first support having a first outer peripheral surface and a first inner peripheral surface;
    a first plurality of diodes mounted to said first inner peripheral surface;
    a second support having a second outer peripheral surface and a second inner peripheral surface;
    a second plurality of diodes mounted to said second inner peripheral surface; and
    a plurality of phase connectors with each phase connector connecting one of said first plurality of diodes to one of said second plurality of diodes, wherein said plurality of phase connectors apply a compressive force to said first plurality of diodes and said second plurality of diodes when said first support and said second support are rotating, and wherein said first support and said second support are plates wherein said first inner peripheral surface and said second inner peripheral surface are facing each other.

2. The rectifier assembly of claim 1, wherein a positive output terminal is connected to said first support and a negative output terminal is connected to said second support.

3. The rectifier assembly of claim 1, wherein said first plurality of diodes and said second plurality of diodes are mounted in compression.

4. The rectifier assembly of claim 1, wherein said first plurality of diodes are soldered to said first support and said second plurality of diodes are soldered to said second support.

5. The rectifier assembly of claim 1, wherein said first support and said second support are heat sinks.

6. The rectifier assembly of claim 1, wherein said first inner peripheral surface and said second inner peripheral surface each have three diode mounting locations.

7. The rectifier assembly of claim 6, wherein said first plurality of diodes comprises three diodes with one of said three diodes being mounted to one of said three diode mounting locations on said first inner peripheral surface and wherein said second plurality of diodes comprises three diodes with one of said three diodes being mounted to one of said three diode mounting locations on said second inner peripheral surface.

8. The rectifier assembly of claim 7, wherein said plurality of phase connectors comprises three phase connectors with one of said three phase connectors connecting one diode of said first plurality of diodes with one diode of said second plurality of diodes.

9. The rectifier assembly of claim 1, wherein said first support and said second support are received within an electrically insulated housing.

10. The rectifier assembly of claim 1, wherein said first support and said second support each have cylindrical outer surfaces.

11. The rectifier assembly of claim 10, wherein said first support and said second support rotate about an axis defined by a center of said cylindrical outer surfaces.

12. The rectifier assembly of claim 11, wherein said first and second inner peripheral surfaces are arranged radially about said axis such that said first plurality of diodes and said second plurality of diodes are perpendicular to said axis.

13. The rectifier assembly of claim 1, wherein said first support and said second support rotate about a common axis, and wherein each of said plurality of phase connectors comprises a body portion extending in a direction that is generally parallel to said common axis.

14. The rectifier assembly of claim 1, wherein each of said plurality of phase connectors comprises a first portion having a planar surface applying a compressive force on one of said first plurality of diodes and a second portion having a planar surface applying a compressive force on one of said second plurality of diodes when said first support and said second support are rotating.

15. A rectifier assembly comprising:
    a first support having a first outer peripheral surface and a first inner peripheral surface, wherein said first inner peripheral surface includes three diode mounting locations;
    a first set of three diodes with one diode mounted at each diode mounting location on said first inner peripheral surface;
    a second support having a second outer peripheral surface and a second inner peripheral surface, wherein said second inner peripheral surface includes three diode mounting locations;
    a second set of three diodes with one diode mounted at each diode mounting location on said second inner peripheral surface;

three phase connectors with each of said three phase connectors being connected to one diode of said first set of three diodes and one diode of said second set of three diodes;
a positive output terminal connected to said first support;
a negative output terminal connected to said second support; and
a housing for receiving said first and said second supports, wherein said three phase connectors apply a compressive force to said first set of three diodes and said second set of three diodes when said first support and said second support are rotating, and wherein said first support and said second support are rings axially spaced from one another.

16. The rectifier assembly of claim 15, wherein said first and second sets of three diodes are mounted in compression.

17. The rectifier assembly of claim 15, wherein said first and second supports are heat sinks.

18. The rectifier assembly of claim 15, wherein said first support and said second support rotate about a common axis and, wherein each of said three phase connectors comprises a body portion extending in a direction that is generally parallel to said common axis.

19. The rectifier assembly of claim 15, wherein each of said three phase connectors comprises a first portion having a planar surface applying a compressive force on one of said first set of three diodes and a second portion having a planar surface applying a compressive force on one of said second set of three diodes when said first support and said second support are rotating.

* * * * *